United States Patent [19]

Pham et al.

[11] Patent Number: 4,885,436
[45] Date of Patent: Dec. 5, 1989

[54] ELECTRONIC MODULE INTERLOCK AND EXTRACTION MECHANISM

[75] Inventors: Hoa Pham, San Jose; Robert C. Max, Daly City, both of Calif.

[73] Assignee: Tandem Computers Incorporated, Cupertino, Calif.

[21] Appl. No.: 238,006

[22] Filed: Aug. 29, 1988

[51] Int. Cl.⁴ .............................................. H01H 3/20
[52] U.S. Cl. .............................. 200/50 A; 200/43.16; 200/50 R
[58] Field of Search ............. 200/50 R, 50 A, 50 AA, 200/50 B, 43.16–43.19, 43.21, 333, 334, 321, 322; 361/338, 339, 343

[56] References Cited

U.S. PATENT DOCUMENTS

| | | | |
|---|---|---|---|
| 2,300,102 | 10/1942 | Christensen | 200/50 A |
| 2,832,857 | 4/1958 | Landmeier | 200/43.19 |
| 3,109,899 | 11/1963 | Pastene | 200/43.19 |
| 3,801,757 | 4/1974 | Carissimi et al. | 200/50 B |
| 3,919,507 | 11/1975 | Middleton, Jr. | 200/50 A |
| 4,071,722 | 1/1978 | Hart | 200/50 A |
| 4,158,116 | 6/1979 | Krueger | 200/43.19 |
| 4,276,458 | 6/1981 | Alter | 200/245 |
| 4,300,030 | 11/1981 | Dimarco et al. | 200/43.19 |
| 4,435,624 | 3/1984 | Sepulveda | 200/43.21 |
| 4,467,152 | 8/1984 | Gordy | 200/43.21 |
| 4,468,544 | 8/1984 | Wainess et al. | 200/43.16 |
| 4,563,552 | 1/1986 | Fushimoto | 200/17 R |
| 4,596,907 | 6/1986 | LaGreco et al. | 200/50 R |
| 4,777,332 | 10/1988 | Diaz | 200/50 A |

*Primary Examiner*—J. R. Scott
*Attorney, Agent, or Firm*—Townsend and Townsend

[57] ABSTRACT

A removable power supply interlock and extraction mechanism (2) includes a switch guard (16), mounted to the front panel (14) of a module (4), movable between a safe position when the power switch (12) is off to keep it off, and a working position, at which the switch can be freely turned on and off. When the module is being inserted into an electrical unit (16), an actuator (34), mounted to the front panel, is rotated in its insertion rotary direction (50) so the switch guard moves from its safe to its working position; simultaneously a latching element (62) on the actuator engages a latching surface (60) on the unit so to drive the module into the unit until the connectors on the module and unit are fully connected. To remove the module, the power switch is first turned off. The actuator is then rotated in its retraction rotary direction (52) causing the switch guard to move into its safe position to keep the switch off; simultaneously the latching element engages the latching surface to drive the module away from the unit thus disconnecting the electrical connectors.

20 Claims, 3 Drawing Sheets

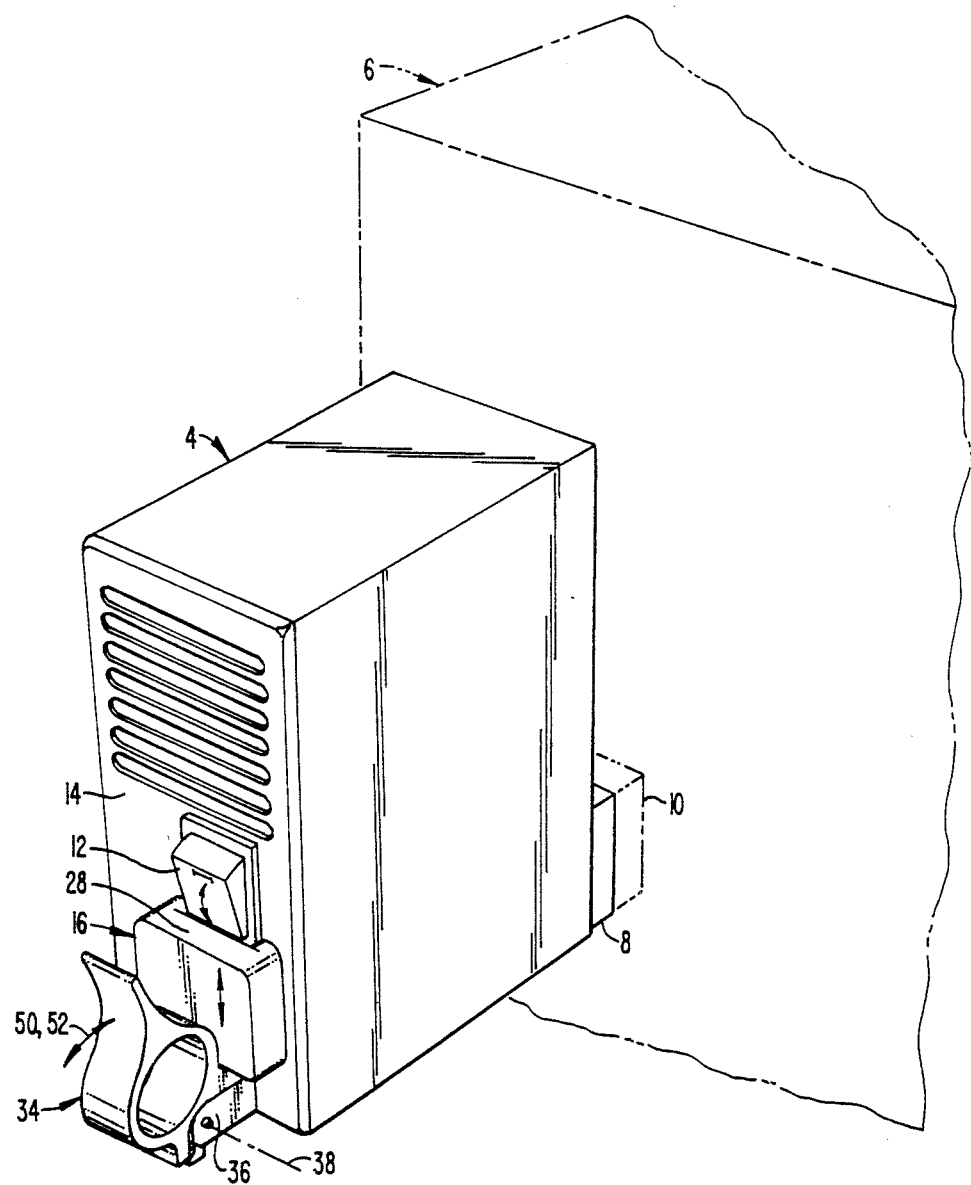
FIG._1.

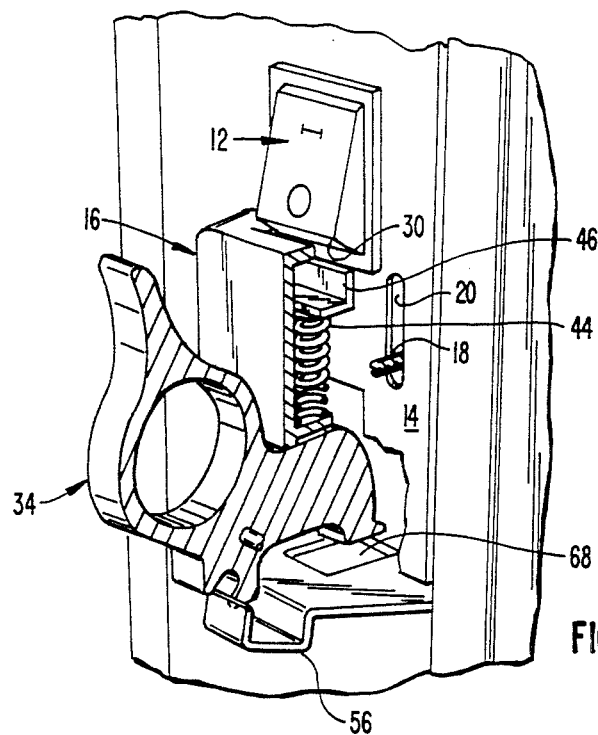
FIG._3.
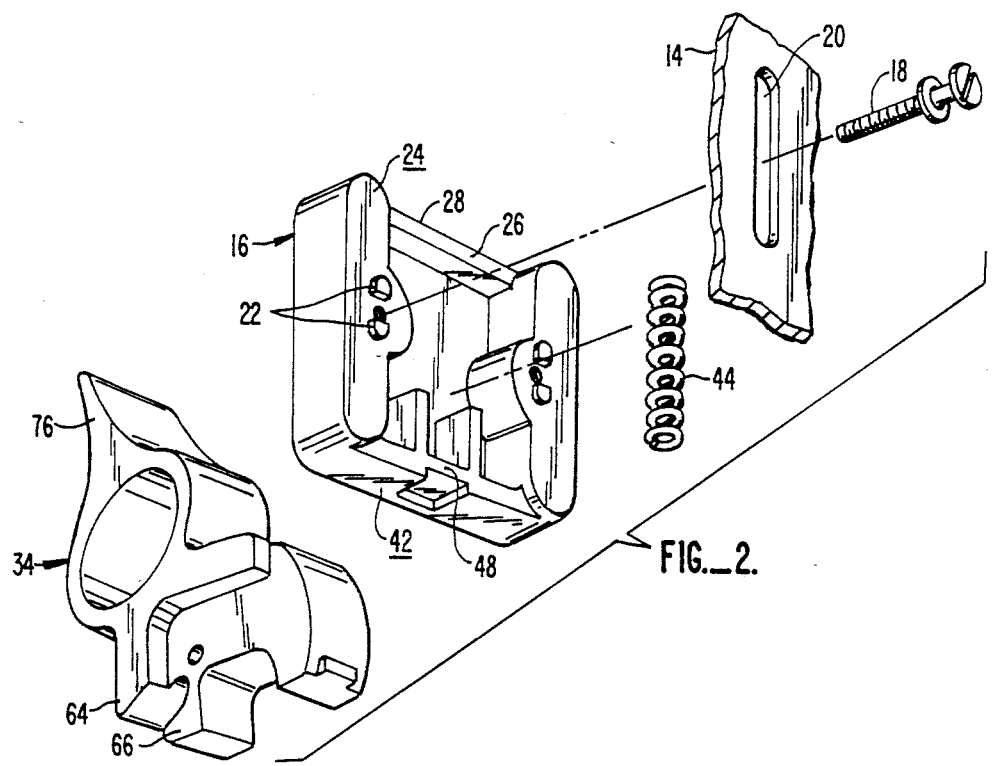
FIG._2.

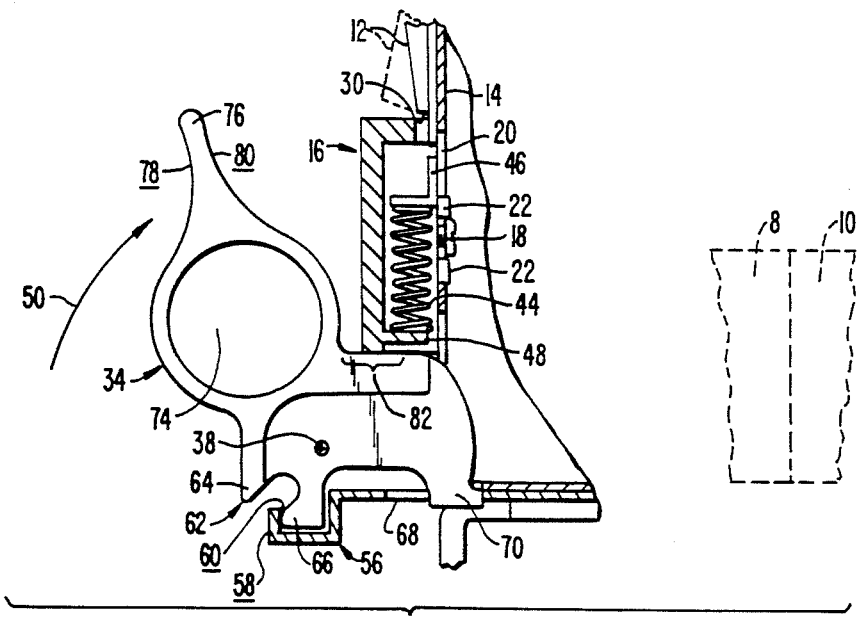
FIG._4A.
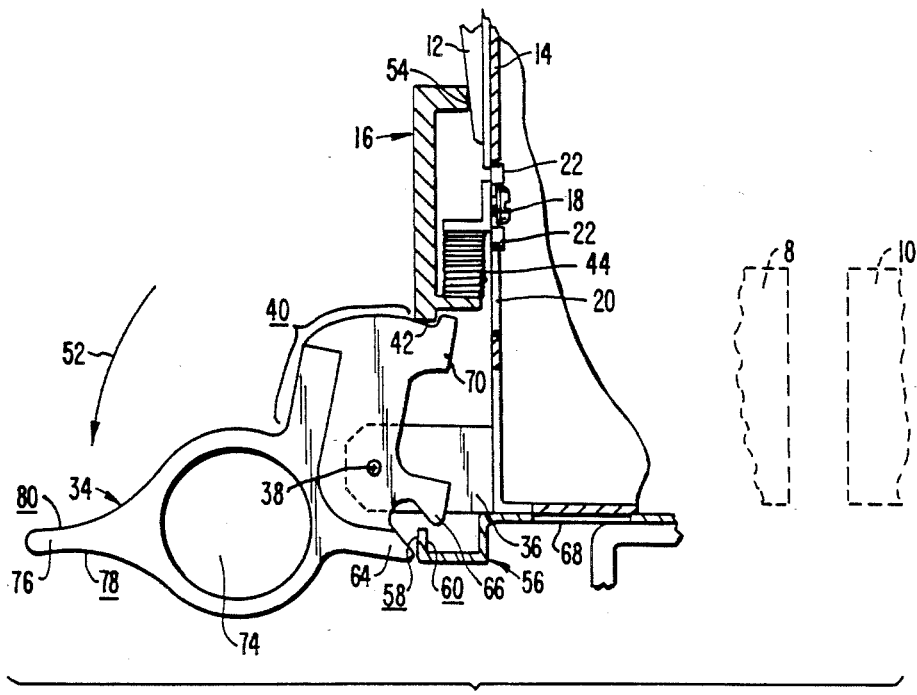
FIG._4B.

ELECTRONIC MODULE INTERLOCK AND EXTRACTION MECHANISM

BACKGROUND OF THE INVENTION

This invention relates to devices for preventing the connection or disconnection of an electronic module from an electrical unit unless the power switch is off. The invention represents an improvement over U.S. patent application Ser. No. 07/065,233, filed June 22, 1987, now U.S. Pat. No. 4,777,332, the disclosure of which is incorporated by reference.

Many electrical units have subassemblies or modules which can be removed from and mounted to the unit. When removed and replaced, mating electrical connectors on the unit and module disconnect and connect. This typically occurs when the module is fully mounted within the unit through the use of blind mateable connectors. That is, electrical connection is made during the final movement of the electronic module into the electrical unit while electrical disconnection is made during the initial movement of the electronic module from the electrical unit.

When using such modules it is important that the power to the electronic module be off when it is removed or replaced. This is necessary to prevent possible damage to the equipment due to high transient voltages which can be created when a live electrical connector is manually disconnected or connected. This problem has been recognized in the art. See, for example, U.S. Pat. No. 3,919,507 to Middleton Jr., dated Nov. 11, 1975.

SUMMARY OF THE INVENTION

The invention relates to a switch interlock and extraction mechanism for an electronic module which permits connection and disconnection of the electrical connectors only when the main power switch is off and which simultaneously engages interlock surfaces on the unit to provide the initial and final driving force for the module as the electrical connectors are connected and disconnected. These functions are achieved using only a signal motion by the operator, typically using only one hand.

The invention is, in one embodiment, used with a removable power supply module of the type used as a part of an electrical unit, such as a computer. The module is typically of the type having a rocker type power switch mounted to the front panel. Other types of power switches are also possible. A switch guard is also mounted to the front panel and moves between safe and working positions. The switch guard can be moved to the safe position only when the switch is off; once in the safe position the switch guard prevents the switch from being moved to its on position. When the switch guard is in its working position, the switch can be freely turned on and off.

A combination interlock and extraction actuator is also mounted to the front of the module and moves, preferably pivots, between insertion and retraction rotary positions. The actuator has two functions which are executed simultaneously. The first is the movement of the switch guard between its safe and working positions. The second is to move or drive the module during electrical connection and disconnection with the electrical unit. Preferably the actuator has a cam surface against which the switch guard rides.

When the module is being inserted into the unit, the actuator, is, just before the electrical connectors on the module and unit become engaged, moved in its insertion direction. As this occurs, the switch guard moves from its safe to its working position; simultaneously a latching element on the actuator engages a latching surface on the unit to drive the module until the connectors are fully connected.

To remove the module, the switch actuator is turned off and the cam actuator is moved in its retraction direction. This causes the switch guard to move into its safe position to prevent the switch actuator from being turned on; simultaneously the latching element on the actuator engages a disengagement surface on the unit to drive the module away from the unit thus disconnecting the electrical connectors.

The switch guard is preferably spring biased against the camming surface of the actuator so to keep the actuator biased in its insertion direction. This helps to prevent inadvertent disconnection of the electrical connectors. This feature is especially useful to keep the electronic module fully engaged with the electrical unit even during transport.

The invention provides a source of safety by keeping the user from inserting or withdrawing the module when the power switch actuator is on. Movement of the switch guard occurs simultaneously with the locking action of the latching element of the actuator engaging the interlock surface of the electrical unit so that the entire sequence occurs with one simple, preferably rotary, movement of the actuator.

The actuator preferably includes a central finger opening and a radially extending thumb drive surface which aid the user in manipulating the actuator. The actuator permits the user to have positive control over both the rotary movement of the actuator and the movement of the electronic module into and out of the electrical unit. The invention thus eliminates the need for a separate handle which would otherwise be needed to pull the electronic module from the electrical unit and push the electronic module into the electrical unit.

The module may be removed by simply first turning off the power switch actuator, and then rotating the cam actuator. Doing the latter both lifts the switch guard, to partially cover the toggle type power switch actuator, and simultaneously pulls the electronic module away from the electrical unit thus disconnecting the electrical connectors. Similarly, final insertion of the electronic module takes place with a single rotary motion of the actuator which simultaneously permits the switch guard plate to lower, thus exposing the switch, and engages the interlock surface of the electrical unit so to drive the electronic module into the electrical unit, thus mating the electrical connectors.

The invention is relatively simple in construction and requires very few modifications to existing electrical unit designs. The camming surface is configured to accommodate tolerance build up. The final portion of the camming surface, designed to contact the spring biased switch guard plate when the cam actuator has been fully rotated in the insertion rotary direction, is sized to take up any slack caused by tolerance build-up in both the electronic module and the electrical unit.

Other features and advantages of the invention will appear from the following description in which the preferred embodiment has been set forth in detail in conjunction with the accompanying drawings.

BRIEF DESCRIPTION OF THE DRAWINGS

FIG. 1 is an isometric view showing the electronic module interlock and extraction mechanism mounted to an electronic module shown relative to an electrical unit with the power switch off.

FIG. 2 is an exploded isometric view of the interlock and extraction mechanism of FIG. 1.

FIG. 3 is a cross-sectional view of the interlock and extraction mechanism of FIG. 1 with the power switch on.

FIGS. 4A and 4B are simplified side views of the interlock and extraction mechanism of FIG. 1. The actuator is rotated in the insertion direction and the switch guard is in the working position of FIG. 4A. The actuator is rotated in the retraction direction and the switch guard is moved to its safe position in FIG. 4B.

DETAILED DESCRIPTION OF THE PREFERRED EMBODIMENT

Referring now to FIGS. 1-3, an electronic module interlock and extraction mechanism 2 is shown used with an electronic module 4, such as a power supply, which is a part of an electrical unit 6, typically a computer. Module 4 can be removed from unit 6, such as for servicing and preventive maintenance. When this occurs a blind mateable electrical connector 8 of electronic module 4 becomes disconnected from a mating electrical connector 10 of electrical unit 6. To protect electrical components of both electronic module 4 and electrical unit 6 during such electrical disconnection, the toggle type power switch 12, mounted to the front panel 14 of electrical module 4, is first switched to the off position of FIG. 1 from the on position of FIG. 3. slidably mounted to front panel 14 by screws 18, which pass through a pair of slots 20 in front panel 14, and projections 22, which extend from the rear surface 24 of switch guard 16. Switch guard 16 includes a cut-away portion 26 on its top edge 28 sized to slide over the bottom edge 30 of power switch 12 when switch 12 is off (see FIG. 1). Cut-away portion 26 is sized so it is blocked from upward movement by bottom edge 30 of switch 12 when the switch is on (see FIG. 3).

Mechanism 2 also includes a combination interlock and extraction actuator 34 pivotally mounted to a pair of extensions 36 of front panel 14 for movement about a pivot axis 38. As shown in FIGS. 4A and 4B, actuator 34 includes a cam surface 40 against which a lower surface 42 of switch guard 16 is biased by a coil spring 44. Spring 44 is captured between an L-bracket 46 extending from front panel 14 and a lower shelf 48 of switch guard 16. Movement of actuator 34 in an insertion direction 50, see FIG. 4A, permits spring 44 to expand thus driving switch guard 16 to its lowered or wrking position shown in FIGS. 1, 3 and 4A. Rotating actuator 34 in the retraction direction 52, see FIG. 4B, causes cam surface 40 to drive switch guard 16 to its upper or safe position of FIG. 4B with cut-away portion 26 lying adjacent a lower portion 54 of power switch 12. As is evident from FIGS. 3, 4A and 4B, actuator 34 can only be moved in retraction direction 52 when power switch 12 is in the off position, shown in solid lines in FIG. 4A. Once switch guard is in the safe position of FIG. 4B, power switch 12 cannot then be turned on.

The interlock mechanism is constructed and operated as follows: Electrical unit 6 includes a C-shaped extension 56 having a pair of vertically extending latching or interlock surfaces 58, 60. Surfaces 58, 60 are engaged by a U-shaped latching element 62 of actuator 34. Element 62 has a pair of opposed portions 64, 66 which engage surfaces 58, 60 when actuator 34 is pivoted in retraction direction 52 and insertion direction 50 respectively. As suggested in FIGS. 4A and 4B, the final movement of module 4 into electrical unit 6, during which electrical connectors 8 and 10 connect with one another, occurs by virtue of actuator 34 being pivoted in insertion direction 50; this causes portion 66 of latching element 62 to engage latching surface 60. Note that extension 56 includes a cut-out 68, shown best in FIG. 3, to accommodate the lower portion 70 of actuator 34 when the actuator is rotated in insertion direction 50.

To begin to remove electronic module 4 from electrical unit 6, thus disconnecting electrical connectors 8, 10, power switch 12 must be in the off position of FIGS. 1 and 4B. Actuator 34 is then rotated in retraction direction 52 causing switch guard 16 to move to the safe position of FIG. 4B; this prevents power switch 12 from being turned on, and generally simultaneously causes portion 64 of latching element 62 to engage latching surface 58 thus driving electronic module to the left in FIG. 4B causing electrical connectors 8, 10 to disengage as schematically suggested in FIG. 4B.

During reinsertion of module 4, actuator 34 must be substantially in the rotary orientation of FIG. 4B, thus ensuring the power switch 12 is off during reinsertion. If actuator 34 were in the rotary orientation of FIG. 4A and if one were to attempt to insert electronic module into electrical unit 6, lower portion 70 of actuator 34 would interfere with this by engaging C-shaped extension 56 thus preventing connection of electrical connectors 8, 10

Actuator 34 includes a finger opening 74 and a radially extending thumb drive 76. Finger opening 74 permits the user to obtain a good grasp on actuator 34 to aid pulling module 4 from electrical unit 6 and pushing the module into the electrical unit. Thumb drive 76 provides a pair of surfaces 78, 80 against which the user's thumb may be placed when rotating actuator 34 in insertion direction 50 and retraction direction 52, respectively. The resulting structure creates the ability for substantially one-handed operation during insertion and retraction of module 4.

The relative positions of pivot axis 38 and latching surface 60 will often vary because of manufacturing tolerances. This affects when electrical connectors 8, 10 engage and disengage.

To help compensate for tolerance build-up, cam surface 40 includes a relatively long final surface portion 82 against which lower surface 42 rests when actuator 34 is in the working rotary orientation of FIG. 4A. Surface portion 82 is long enough to accommodate a range of final rotary orientations of actuator 34 when electronic module is fully inserted within electrical unit 6 so that connectors 8, 10 are fully engaged.

In the preferred embodiment power switch 12 is a toggle switch and switch guard 16 slides to cover one end 54 of the power switch when switch 12 is off. Power switches having other types of movement, and corresponding appropriately configured switch guards, could also be used. Also, instead of connecting actuator 34 and switch guard 16 through cam surface 40 and lower surface 42, actuator 34 and switch guard 16 could be coupled in other manners, such as through a linkage arrangement. However, the present arrangement is relatively simple and effective both in its primary function of providing an interlocking extraction mechanism and also one of its secondary functions, that of helping to keep electronic module 4 fully engaged within electrical unit 6 by virtue of the spring bias of switch guard 16 against cam surface 40.

Other modification and variation can be made to the disclosed embodiment without departing from the subject of the invention as defined in the following claims.

What is claimed is:

1. A removable electronic module interlock and extraction mechanism, the module of the type for u·e with an electrical unit, the module including an enclosure having a first panel, the module and electrical unit having mating connectors, the mechanism comprising:

a switch mounted to the first panel movable between first and second positions;

a switch guard movably mounted to the first panel for movement between third and fourth positions, tne switch guard being movable to the four*n position only when the switch is in the first position, the switch guard and switch being configured to prevent the switch from moving from the first positi n to the second position when the switch guard is in the fourth position;

an actuator movably mounted to the enclosure adjacent the switch guard for movement between fifth and sixth positions, the actuator configured to move the switch guard from the third to the fourth positions when the actuator is moved from the fifth to the sixth positions;

the actuator including a grasping element for urging the module into and out of the electrical unit; and means for biasing the switch plate from the third to the fourth positions and against the actuator.

2. The mechanism of claim 1 further comprising a latching surface associated with the electrical unit.

3. The mechanism of claim 2 wherein the actuator further comprises means for applying the actuator to the switch guard, the means for applying being configured to allow the distance between the electrical unit latching surface and the electrical unit mating connector to vary within predetermined limits without affecting operability of the mechanism.

4. The mechanism of claim 3 wherein the means for applying includes a cam surface on the actuator, against which the switch guard rides, which drives the switch guard between the third and fourth positions.

5. The mechanism of claim 4 wherein the cam surface includes an extended cam surface region which the switch guard engages when in the third position.

6. The mechanism of claim 2 wherein the actuator includes a latching element sized and positioned to engage the latching surface as the actuator moves between the fifth and sixth positions.

7. The mechanism of claim 6 wherein the actuator further comprises means for connecting the module connector with the electrical unit connector when the actuator moves from the fifth position to the sixth position and for moving the module connector away from the electrical unit connector when the actuator moves from the sixth position to the fifth position.

8. The housing of claim 7 wherein the actuator is pivotally mounted to the first panel and the fifth and sixth positions are different rotary orientations.

9. The mechanism of claim 8 wherein the grasping element includes a finger opening and a thumb drive extending radially away from the finger opening by which a user can grasp, rotate, push and pull the actuator.

10. The mechanism of claim 1 wherein the biasing means includes a spring.

11. A power supply interlock and extraction mechanism of the type for use with a power supply removably housed within an electrical unit, the power supply and electrical unit having blind mateable plugs which mate when the power supply is fully inserted within the electrical unit, the electrical unit having an interlock surface, the power supply having a front panel with an on-off switch mounted thereto, the mechanism comprising:

switch guard means, mounted to the front panel for movement between safe and working positions, for preventing the on-off switch from moving from its off position to its on position when in the safe position and for permitting free movement of the on-off switch between its on and off positions when in the working position;

means for biasing the switch guard means towards its working position;

actuator means, pivotally mounted to the front panel, for (a) simultaneously driving the switch guard means to its safe position and driving the power supply away from its fully inserted position thereby uncoupling the blind mateable connectors when the actuator means is rotated in a first rotary direction, and (b) simultaneously permitting the biasing means to move the switch guard means to its working position and driving the power supply toward its fully inserted position thereby coupling the blind mateable connectors when the actuator means is rotated in a second rotary direction; and means for applying the actuator means to the switch guard means, the means for applying being configured to allow the distance between the electric unit interlock surface and the electrical unit mateable plug to vary within predetermined limits without affecting the operability of the mechanism.

12. The mechanism of claim 11 wherein the actuator means includes a finger opening and a thumb drive extending radially from the finger opening for one-handed manipulation of the actuator means.

13. A switch interlock and extraction mechanism for use with an electrical module having a first connector which connects to a second connector mounted to an electrical unit when the module is fully mounted to the unit, the electrical module including a switch movable between on and off positions, the mechanism comprising:

a switch guard, mounted to the module, movable between safe and working positions, the switch being retained in its off position when the switch guard is in its safe position, the switch being free to move between its on and off positions when the switch guard is in its working positions; and actuator means, pivotally mounted to the electrical module for rotary movement in insertion and retraction rotary directions, for simultaneously (a) moving the switch guard between its safe and working positions, and (b) moving the module between fully mounted and at least partially dismounted positions as the first and second connectors move between connected and disconnected conditions.

14. The improved mechanism of claim 13 further comprising an interlock surface on the electrical unit, the actuator means including means for engaging the interlock surface to translate the rotary movement of the actuator into movement of the module between the fully mounted and at least partially dismounted positions.

15. The improved mechanism of claim 14 wherein the actuator means includes a finger opening and a thumb drive extending radially from the finger opening for one-handed manipulation of the actuator means.

16. The improved mechanism of claim 15 wherein the actuator means further comprises means for applying the actuator means to the switch guard, the means for applying being configured to allow the distance between the interlock surface and the second connector to vary within predetermined limits without affecting the operability of the mechanism.

17. The improved mechanism of claim 15 further comprising means for compensating for tolerance build-up among the positions of the interlock surface, the first connector and the second connector.

18. The improved mechanism of claim 13 further comprising means for biasing the switch guard towards one of the safe and working positions.

19. The improved mechanism of claim 18 wherein the biasing means resiliently biases the switch guard towards the working position.

20. The improved mechanism of claim 19 wherein the actuator means includes a cam surface against which the switch guard is biased by the biasing means.

* * * * *